(12) United States Patent
Kim et al.

(10) Patent No.: US 10,872,672 B2
(45) Date of Patent: Dec. 22, 2020

(54) NONVOLATILE MEMORY DEVICE, MEMORY SYSTEM INCLUDING NONVOLATILE MEMORY DEVICE, AND METHOD OF CONTROLLING NONVOLATILE MEMORY DEVICE

(71) Applicant: SAMSUNG ELECTRONICS CO., LTD., Suwon-si (KR)

(72) Inventors: Deahan Kim, Seoul (KR); Minsoo Kim, Uiwang-si (KR); Kyunghoon Sung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/506,667

(22) Filed: Jul. 9, 2019

(65) Prior Publication Data
US 2020/0135281 A1    Apr. 30, 2020

(30) Foreign Application Priority Data

Oct. 29, 2018    (KR) .......................... 10-2018-0129930

(51) Int. Cl.
*G11C 11/34*    (2006.01)
*G11C 16/06*    (2006.01)
(Continued)

(52) U.S. Cl.
CPC .............. *G11C 16/26* (2013.01); *G11C 16/08* (2013.01); *G11C 16/12* (2013.01); *G11C 16/30* (2013.01)

(58) Field of Classification Search
CPC ......... G11C 16/26; G11C 16/08; G11C 16/12; G11C 16/30
See application file for complete search history.

(56) References Cited

U.S. PATENT DOCUMENTS 5,986,940 A    11/1999    Atsumi et al.
7,446,549 B2    11/2008    Tomita et al.
(Continued)

FOREIGN PATENT DOCUMENTS

JP    2005322324 A    11/2005

*Primary Examiner* — Toan K Le
(74) *Attorney, Agent, or Firm* — Volentine, Whitt & Francos, PLLC

(57) ABSTRACT

A nonvolatile memory device includes a memory cell array includes memory cells, a row decoder, a page buffer circuit and a control logic circuit. The row decoder is connected to the memory cells through word lines and includes switches configured to select the word lines, respectively. The page buffer circuit is connected to the memory cell array through bit lines. The control logic circuit is configured to perform operational functions when the row decoder turns on a switch corresponding to a particular word line among the word lines. The operational functions include supplying a charging voltage to the particular word line through the switch, stopping the supply of the charging voltage after the charging voltage is supplied to the particular word line, leaking a fixed current from the particular word line through the switch after stopping the supply of the charging voltage, and outputting, to an external device, time information about a time from when the fixed current is initially leaked to a time when a voltage of the particular word line becomes lower than a reference voltage.

19 Claims, 13 Drawing Sheets

(51) Int. Cl.
G11C 16/26 (2006.01)
G11C 16/30 (2006.01)
G11C 16/12 (2006.01)
G11C 16/08 (2006.01)

(56) References Cited

U.S. PATENT DOCUMENTS

| | | |
|---|---|---|
| 7,679,133 B2 | 3/2010 | Son et al. |
| 7,768,814 B2 | 8/2010 | Argawal et al. |
| 8,379,454 B2 | 2/2013 | Kochar et al. |
| 8,553,466 B2 | 10/2013 | Han et al. |
| 8,559,235 B2 | 10/2013 | Yoon et al. |
| 8,634,264 B2 | 1/2014 | Yamada |
| 8,654,587 B2 | 2/2014 | Yoon et al. |
| 9,455,032 B2 | 9/2016 | Kang |
| 9,903,901 B2 | 2/2018 | Jeon et al. |
| 2011/0233648 A1 | 9/2011 | Seol et al. |
| 2012/0281479 A1* | 11/2012 | Kochar ................ G11C 29/025 365/185.19 |
| 2013/0229868 A1* | 9/2013 | Koh .................... G11C 11/5685 365/185.03 |
| 2014/0084936 A1* | 3/2014 | Pan ...................... G11C 29/025 324/509 |
| 2014/0085985 A1* | 3/2014 | Pan ........................ G11C 16/08 365/185.18 |
| 2017/0316834 A1* | 11/2017 | Huynh ............... G11C 16/3459 |

\* cited by examiner

NONVOLATILE MEMORY DEVICE, MEMORY SYSTEM INCLUDING NONVOLATILE MEMORY DEVICE, AND METHOD OF CONTROLLING NONVOLATILE MEMORY DEVICE

CROSS-REFERENCE TO RELATED APPLICATIONS

This U.S. non-provisional patent application claims priority under 35 U.S.C. § 119 to Korean Patent Application No. 10-2018-0129930, filed on Oct. 29, 2018 in the Korean Intellectual Property Office, the disclosure of which is incorporated by reference herein in its entirety.

BACKGROUND

1. Field of the Disclosure

The present disclosure relates to a semiconductor device. More particularly, the present disclosure relates to a nonvolatile memory device that supports the measurement of characteristics of the nonvolatile memory device, a memory system including the nonvolatile memory device, and a method of controlling the nonvolatile memory device.

2. Description of the Related Art

A nonvolatile memory device is manufactured using semiconductor material. Some examples of a nonvolatile memory device include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), and a ferroelectric RAM (FRAM).

The degree of integration and the volume of the nonvolatile memory device continue to increase as semiconductor manufacturing technologies develop. The high degree of integration of the nonvolatile memory device lowers manufacturing costs. However, the high degree of integration of the nonvolatile memory device causes a scale-down and a change in the structure thereof. Thus, various new issues continue to emerge. To solve the new issues relating to the high degree of integration, a new method or device for measuring characteristics of the nonvolatile memory device more accurately is required.

SUMMARY

Embodiments of the present disclosure provide a nonvolatile memory device that supports the measurement of characteristics of the nonvolatile memory device, a memory system including the nonvolatile memory device, and a method of controlling the nonvolatile memory device.

According to an exemplary embodiment, a nonvolatile memory device includes a memory cell array that includes memory cells, a row decoder, a page buffer circuit and a control logic circuit. The row decoder is connected to the memory cells through word lines and includes switches configured to select the word lines, respectively. The page buffer circuit is connected to the memory cell array through bit lines. The control logic circuit is configured to perform operational functions when the row decoder turns on a switch corresponding to a particular word line among the word lines. The operational functions include supplying a charging voltage to the particular word line through the switch, stopping the supply of the charging voltage after the charging voltage is supplied to the particular word line, leaking a fixed current from the particular word line through the switch after stopping the supply of the charging voltage, and outputting, to an external device, time information about a time from when the fixed current is initially leaked to a time when a voltage of the particular word line becomes lower than a reference voltage.

According to another exemplary embodiment, a memory system includes a nonvolatile memory device that includes memory cells connected to word lines and bit lines, and a controller that transmits a command and an address to the nonvolatile memory device. In response to the command, the nonvolatile memory device is configured to transmit, to the controller, first information representing a total capacitance including a first capacitance of a word line corresponding to the address among the word lines and a second capacitance of a peripheral circuit associated with the word line, and second information representing the second capacitance of the peripheral circuit. The controller is configured to calculate the first capacitance of the word line based on the first information and the second information.

According to yet another exemplary embodiment, a control method of controlling a nonvolatile memory device which includes memory cells connected with a word line includes charging a charging voltage to the word line and a peripheral circuit connected with the word line. The control method also includes leaking a fixed current from the peripheral circuit to detect a total capacitance of the word line and the peripheral circuit, charging the charging voltage to the peripheral circuit, leaking the fixed current from the peripheral circuit to detect a capacitance of the peripheral circuit, and subtracting the capacitance of the peripheral circuit from the total capacitance to calculate a capacitance of the word line.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure may be described in detail and clearly to such an extent that one of ordinary skill in the art easily implements the inventive concept(s) described herein.

Figure 1:
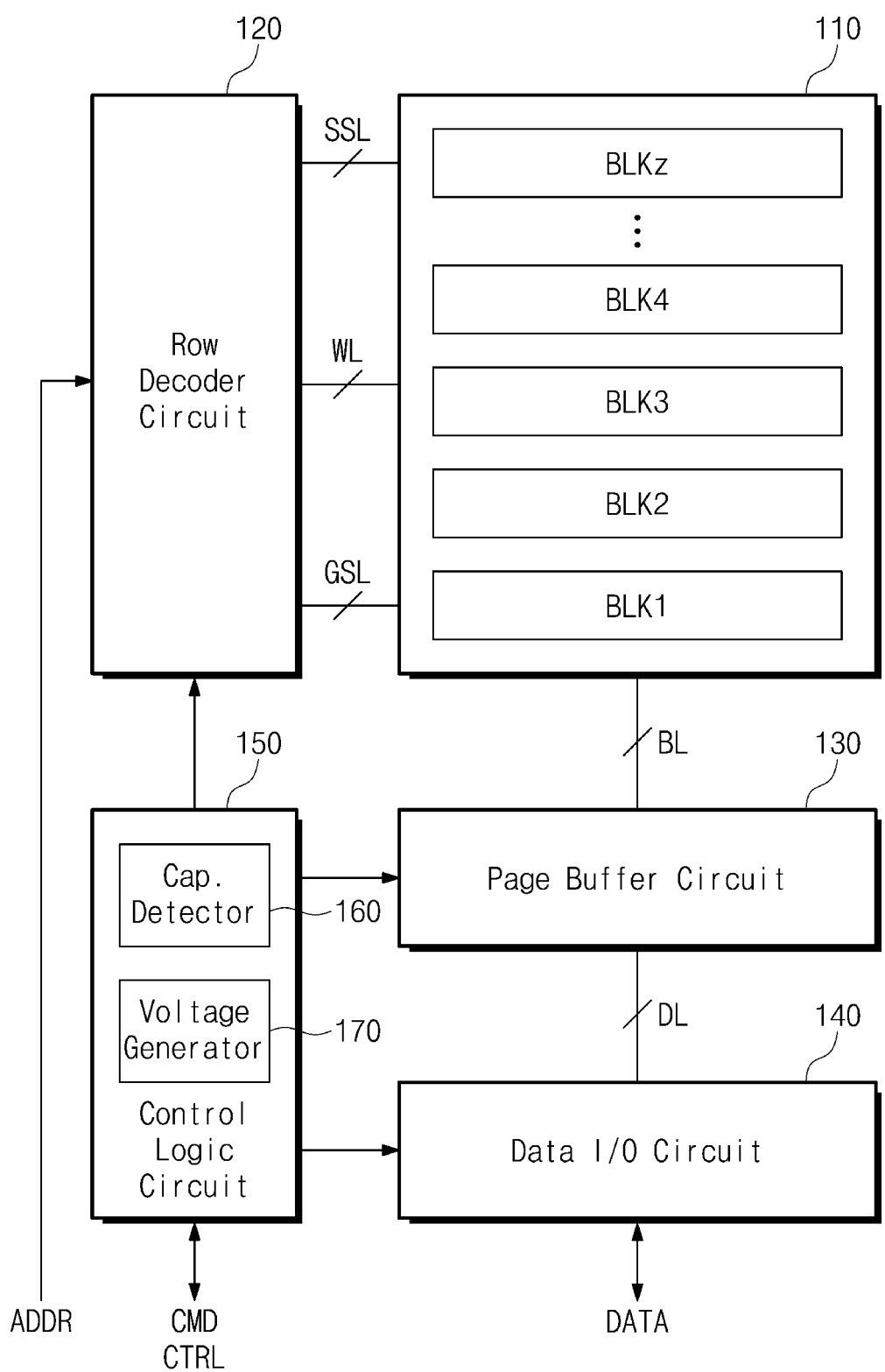
FIG. 1 is a block diagram illustrating a nonvolatile memory device according to an embodiment of the present disclosure.

FIG. 1 is a block diagram illustrating a nonvolatile memory device 100 according to an embodiment of the present disclosure. Referring to FIG. 1, the nonvolatile memory device 100 may include a memory cell array 110, a row decoder circuit 120, a page buffer circuit 130, a data input/output circuit 140, and a control logic circuit 150.

The memory cell array 110 includes multiple memory blocks BLK1 to BLKz. Each of the memory blocks BLK1 to BLKz may include multiple memory cells. Each of the memory blocks BLK1 to BLKz may be connected to the row decoder circuit 120 through at least one ground selection line GSL, word lines WL, and at least one string selection line SSL.

Each of the memory blocks BLK1 to BLKz may be connected to the page buffer circuit 130 through multiple bit lines BL. The memory blocks BLK1 to BLKz may be connected in common to the bit lines BL. The memory blocks BLK1 to BLKz may have identical structures. Additionally, the memory cells of each of the memory blocks BLK1 to BLKz may have identical structures or otherwise be of the same type.

In an embodiment, each of the memory blocks BLK1 to BLKz may correspond to a unit of an erase operation. The memory cells of the memory cell array 110 may be erased for each memory block. Memory cells belonging to one memory block may be erased at the same time, such as, for example, simultaneously, together based on a common instruction, or in an uninterrupted period. For another example, each memory block may be divided into multiple sub-blocks. Each of the sub-blocks may correspond to a unit of the erase operation. Memory cells of the memory cell array 110 may be erased for each memory sub-block rather than or in addition to for each memory block.

The row decoder circuit 120 is connected to the memory cell array 110 through multiple ground selection lines GSL, the word lines WL, and multiple string selection lines SSL. The row decoder circuit 120 operates under control of the control logic circuit 150.

The row decoder circuit 120 may receive an address ADDR through a first channel (e.g., an input/output channel) from an external controller, and may decode the received address ADDR. The row decoder circuit 120 may control voltages to be applied to the string selection lines SSL, the word lines WL, and the ground selection lines GSL based on the decoded address ADDR. A first channel and a second channel are not shown in FIG. 1, but as explained below the control logic circuit 150 may selectively route the first channel to the row decoder circuit 120 or the data input/output circuit 140. The second channel is used by the control logic circuit 150 to transmit or exchange a control signal CTRL with the external controller through a second channel.

The page buffer circuit 130 is connected to the memory cell array 110 through the bit lines BL. The page buffer circuit 130 is connected with the data input/output circuit 140 through multiple data lines DL. The page buffer circuit 130 operates under control of the control logic circuit 150.

In a write operation, the page buffer circuit 130 may store data to be written to memory cells. The page buffer circuit 130 may apply voltages to the bit lines BL based on the stored data. In a verification read operation associated with the read operation, the write operation, or the erase operation, the page buffer circuit 130 may sense voltages of the bit lines BL and may store a result of the sensing operation.

The data input/output circuit 140 is connected with the page buffer circuit 130 through the data lines DL. The data input/output circuit 140 may output data read by the page buffer circuit 130 to the external controller through the first channel (e.g., the input/output channel). The data input/output circuit 140 may also transmit to the page buffer circuit 130 data received from the external controller through the first channel (e.g., the input/output channel).

The control logic circuit 150 may exchange a control signal CTRL with the external controller through a second channel (e.g., a control channel). The control logic circuit 150 may receive a command CMD through the first channel (e.g., the input/output channel) in response to the control signal CTRL. The control logic circuit 150 may decode the received command CMD and may control the nonvolatile memory device 100 depending on (based on) the decoded command. The control logic circuit 150 may selectively route the first channel (e.g., the input/output channel) to the row decoder circuit 120 or the data input/output circuit 140 in response to the control signal CTRL.

The control logic circuit 150 may include a capacitance detector 160 and a voltage generator 170. The capacitance detector 160 may detect capacitances of internal components of the nonvolatile memory device 100. The capacitance detector 160 may allow the external controller to measure characteristics of the nonvolatile memory device 100 by outputting pieces of information representing the capacitances.

The voltage generator 170 may generate various voltages used in the nonvolatile memory device 100. Also, the voltage generator 170 may generate voltages necessary for the capacitance detector 160 to detect the capacitances.

Before proceeding, it should be clear that FIGs. herein including FIG. 1 show and reference circuitry with labels such as "circuit", "detector", "decoder", "generator" and "controller". Such circuitry may include a processor including a microprocessor or application specific integrated circuit (ASIC) and other elements with other labels. As is traditional in the field of the inventive concept(s) described herein, examples may be described and illustrated in terms of blocks such as circuits and other elements which carry out a described function or functions. These blocks, which may be referred to herein as a circuit, detector, decoder, generator, a controller or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the present disclosure. Likewise, the blocks of the examples may be physically combined into more complex blocks without departing from the scope of the present disclosure.

Figure 2:
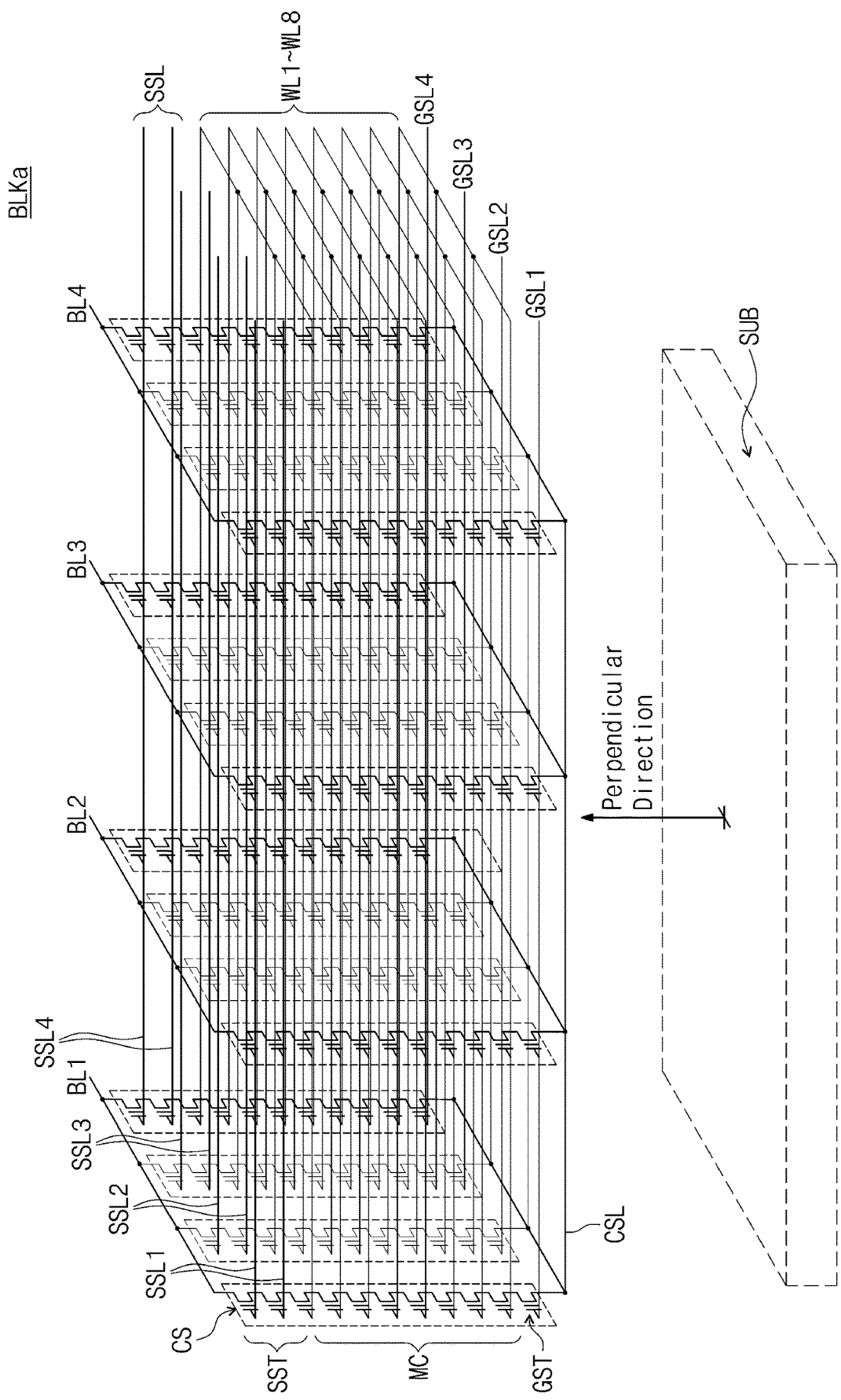
FIG. 2 is a circuit diagram illustrating an example of one of the memory blocks of FIG. 1 according to an embodiment of the present disclosure.

FIG. 2 is a circuit diagram of an example of one memory block BLKa of the memory blocks BLK1 to BLKz of FIG. 1. Referring to FIG. 2, multiple cell strings CS may be positioned on a substrate SUB in rows and columns. The cell strings CS may be connected in common to a common source line CSL formed on (or in) the substrate SUB. In FIG. 2, a location of the substrate SUB is illustrated to help understand a structure of the memory block BLKa.

The example illustrated in FIG. 2 shows the common source line CSL physically connected to lower ends of the cell strings CS. However, it is sufficient that the common source line CSL is electrically connected to the lower ends of the cell strings CS. The embodiments described herein are not limited to the case that the common source line CSL is physically located at the lower ends of the cell strings CS. The example illustrated in FIG. 2 shows the cell strings CS arranged in a four-by-four matrix; but, the number of cell strings CS in the memory block BLKa may vary from a four-by-four matrix to be an increased number of cell strings CS or a decreased number of cell strings CS.

Cell strings CS of each row may be connected in common to the ground selection line GSL and to corresponding string selection lines of a first string selection line SSL1 to a fourth string selection line SSL4. Cell strings CS of each column may be connected to a corresponding bit line of a first bit line BL1 to a fourth bit line BL4. For ease of illustration, cell strings CS connected to the second string selection line SSL2 and third string selection line SSL3 are depicted to be blurred.

Each cell string CS may include at least one ground selection transistor GST connected to the ground selection line GSL, multiple memory cells MC1 to MC8 respectively connected to multiple word lines WL1 to WL8, and string selection transistors SST respectively connected to the string selection lines SSL1, SSL2, SSL3, or SSL4.

In each cell string CS, the ground selection transistor GST, the memory cells MC1 to MC8, and the string selection transistors SST may be serially connected to each other along a direction perpendicular to the substrate SUB and may be sequentially stacked along the direction perpendicular to the substrate SUB. In each cell string CS, one or more of the memory cells MC1 to MC8 may be used as a dummy memory cell(s). The dummy memory cell(s) may not be programmed (e.g., may be program-inhibited) or may be programmed to be different from other memory cells among the memory cells MC1 to MC8.

In an embodiment, memory cells that are located at the same height and are associated with the string selection lines SSL1, SSL2, SSL3, or SSL4 may form one physical page. Memory cells of one physical page may be connected to one sub-word line. Sub-word lines of different physical pages located at the same height may be connected in common to one word line.

In an embodiment, sub-word lines of different physical pages located at the same height may be connected to each other in a single layer at the height at which the sub-word lines are formed. For another example, sub-word lines of different physical pages located at a first height in one layer may be indirectly connected to sub-word lines of different physical pages located at a second height in another layer such as a metal layer.

As illustrated in FIG. 2, the word lines WL1 to WL8 are connected to control gates of the memory cells MC. Capacitances (e.g., parasitic capacitances) of the word lines WL1 to WL8 are associated with a time constant with which voltages of the word lines WL1 to WL8 vary. Accordingly, the capacitances of the word lines WL1 to WL8 have an influence on an operating speed of the memory cells MC1 to MC8.

In particular, due to the miniaturization and high integration of the memory cell array 110, the number of memory cells connected to one word line sharply increases. This causes an increase in the capacitances of the word lines WL1 to WL8. Also, the miniaturization and high integration of the memory cell array 110 may allow each of the word lines WL1 to WL8 to be positioned more closely adjacent to any other word line(s) or any other conductive line(s), thereby causing an increase in the capacitances of the word lines WL1 to WL8.

The accurate measurement of the capacitances of the word lines WL1 to WL8 may be used to accurately capture the performance of the nonvolatile memory device 100 and to accurately predict power consumption of the nonvolatile memory device 100. The nonvolatile memory device 100 according to an embodiment of the present disclosure may support the measurement of the capacitances of the word lines WL1 to WL8 by using the capacitance detector 160. For example, accurate measurements may be used to diagnose errors of the nonvolatile memory device 100, improve performance and functionality of the nonvolatile memory device 100, and provide remedies for errors of the nonvolatile memory device 100. For example, a portion of the nonvolatile memory device 100 may be designated to be bad (faulty) based on the accurate measurements described herein.

Figure 3:
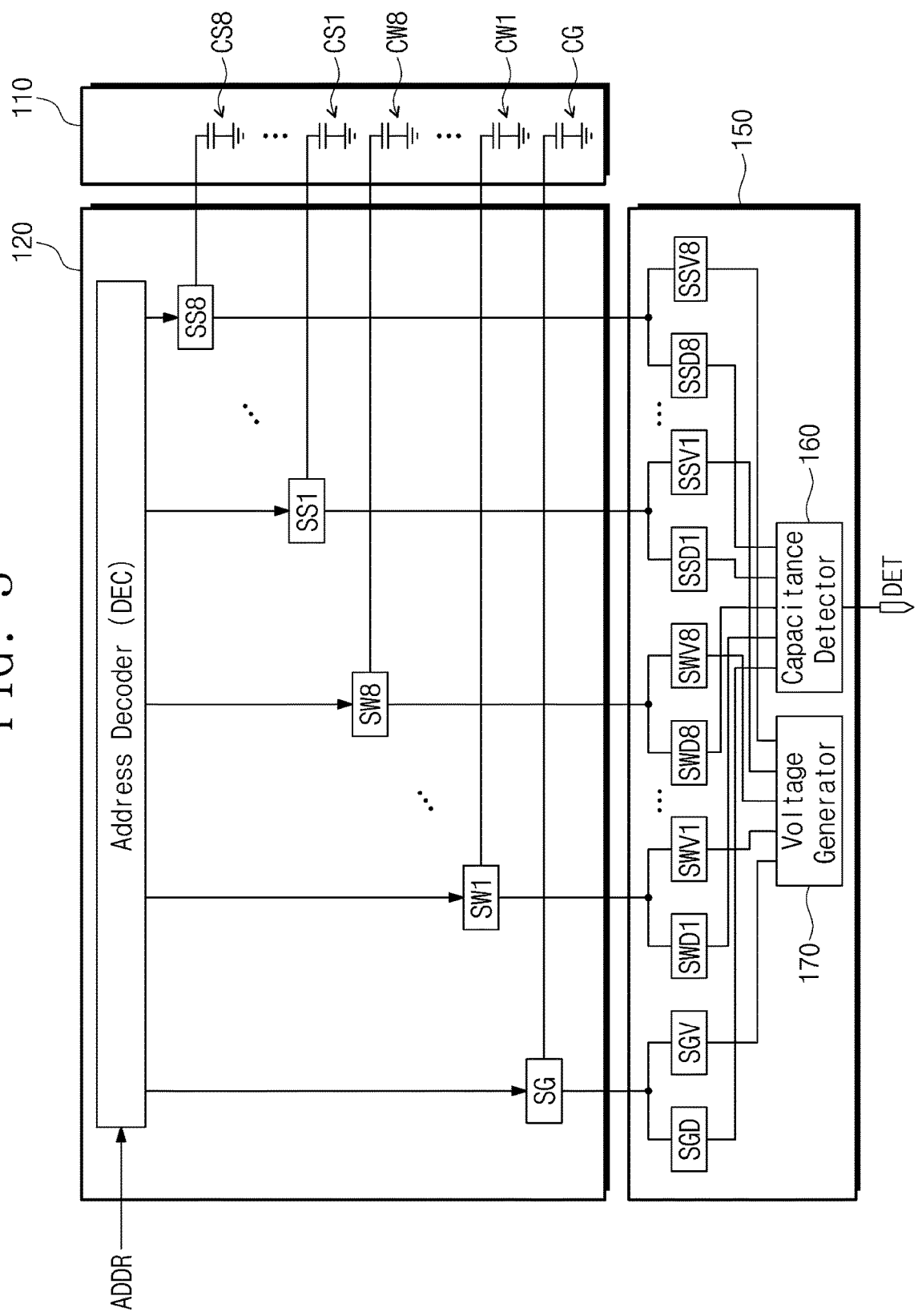
FIG. 3 illustrates elements of a memory cell array, a row decoder circuit, and a control logic circuit for supporting the measurement of capacitances of word lines according to an embodiment of the present disclosure.

FIG. 3 illustrates elements of the memory cell array 110, the row decoder circuit 120, and the control logic circuit 150 for supporting the measurement of capacitances of the word lines WL1 to WL8 according to an embodiment of the present disclosure.

Referring to FIGS. 1 to 3, capacitances of the string selection lines SSL1 to SSL4 of the memory cell array 110 may be modeled with a first string capacitor CS1 to an eighth string capacitor CS8. The capacitances of the first word line WL1 to the eighth word line WL8 may be modeled with a first word capacitor to an eighth word capacitor CW8. A capacitance of the ground selection line GSL may be modeled with a ground capacitor CG.

The row decoder circuit 120 may include a first string switch SS1 to an eighth string switch SS8 respectively corresponding to the first string selection line SSL1 to the fourth string selection line SSL4. The first string switch SS1 to the eighth string switch SS8 may respectively correspond to the first string capacitor CS1 to the eighth string capacitor CS8.

The row decoder circuit 120 may include a first word switch SW1 to an eighth word switch SW8 respectively corresponding to the first word line WL1 to the eighth word line WL8. The first word switch SW1 to the eighth word switch SW8 may respectively correspond to the first word capacitor CW1 to the eighth word capacitor CW8. The row decoder circuit 120 may include a ground switch SG corresponding to the ground selection line GSL. The ground switch SG may correspond to the ground capacitor CG.

The row decoder circuit 120 may include an address decoder DEC. The address decoder DEC may receive the address ADDR. The address decoder DEC may selectively and electrically connect string switches, word switches and the ground switch SG to string capacitors, word capacitors and the ground capacitor CG. Specifically, the address decoder may selectively and electrically connect the first string switch SS1 to the eighth string switch SS8 to the first string capacitor CS1 to the eighth string capacitor CS8 depending on (based on) the address ADDR, respectively. The address decoder may selectively and electrically connect the first word switch SW1 to the eighth word switch SW8 to the first word capacitor CW1 to the eighth word capacitor CS8 depending on (based on) the address ADDR, respectively. The address decoder may also selectively and electrically connect the ground switch SG to the ground capacitor CG depending on (based on) the address ADDR, respectively.

The control logic circuit 150 may include first string voltage switch SSV1 to eighth string voltage switch SSV8 and first string detecting switch SSD1 to eighth string detecting switch SSD8, which respectively correspond to the first string switch SS1 to the eighth string switch SS8. The first string voltage switch SSV1 to the eighth string voltage switch SSV8 may selectively connect the first string switch SS1 to the eighth string switch SS8 to the voltage generator 170. The first string detecting switch SSD1 to the eighth string detecting switch SSD8 may selectively connect the first string switch SS1 to the eighth string switch SS8 to the capacitance detector 160.

The control logic circuit 150 may include a first word voltage switch SWV1 to an eighth word voltage switch SWV8 and a first word detecting switch SWD1 to an eighth word detecting switch SWD8, which respectively correspond to the first word switch SW1 to the eighth word switch SW8. The first word voltage switch SWV1 to the eighth word voltage switch SWV8 may selectively connect the first word switch SW1 to the eighth word switch SW8 to the voltage generator 170. The first word detecting switch SWD1 to the eighth word detecting switch SWD8 may selectively connect the first word switch SW1 to the eighth word switch SW8 to the capacitance detector 160.

The control logic circuit 150 may include a ground voltage switch SGV and a ground detecting switch SGD corresponding to the ground switch SG. The ground voltage switch SGV may selectively connect the ground switch SG to the voltage generator 170. The ground detecting switch SGD may selectively connect the ground switch SG to the capacitance detector 160.

The capacitance detector 160 may output information representing a capacitance (e.g., a parasitic capacitance of a particular line) of a particular capacitor of the ground capacitor CG, the first word capacitor CW1 to the eighth word capacitor CW8, and the first string capacitor CS1 to the eighth string capacitor CS8, to the outside (e.g., to an external controller) depending on (based on) a particular order. The voltage generator 170 may output voltages necessary for the capacitance detector 160 to detect information representing a capacitance. For example, as described below, the voltage generator may be configured to output a charging voltage VCAR and a reference voltage Vref.

Figure 4:
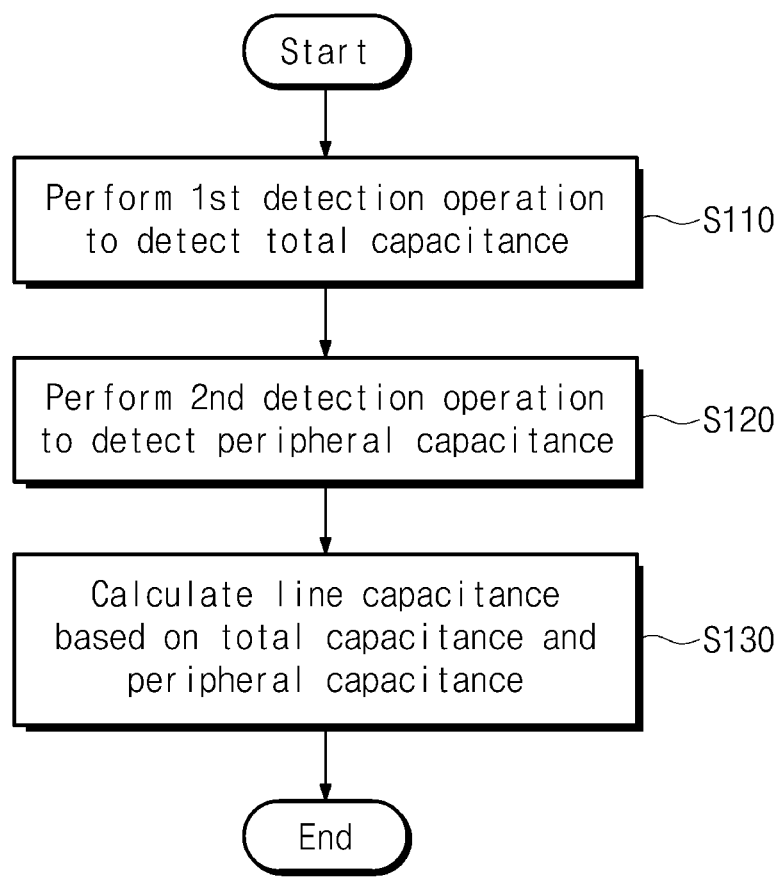
FIG. 4 is a flowchart illustrating a method in which a nonvolatile memory device measures a capacitance of a particular line according to an embodiment of the present disclosure.

FIG. 4 is a flowchart illustrating a method in which the nonvolatile memory device 100 measures a capacitance of a particular line. Referring to FIGS. 1 to 4, in operation S110, the capacitance detector 160 may perform a first detection operation. Through the first detection operation, the capacitance detector 160 may detect a total capacitance of a particular line of (among) the ground selection line GSL, the word lines WL, and the string selection lines SSL1 to SSL4.

The total capacitance may include a parasitic capacitance of the particular line and a parasitic capacitance of a peripheral circuit associated with the particular line. The peripheral circuit associated with the particular line may include a parasitic capacitance of paths and elements positioned between a switch of the row decoder circuit 120 associated with the particular line and the capacitance detector 160 of the control logic circuit 150.

In operation S120, the capacitance detector 160 may detect a parasitic capacitance of the peripheral circuit associated with the particular line. In operation S130, a capacitance of the particular line may be calculated based on the total capacitance and the capacitance of the peripheral circuit. For example, the capacitance of the particular line may be calculated by subtracting the capacitance of the peripheral circuit from the total capacitance. For example, operation S130 may be performed by an external controller of the nonvolatile memory device 100.

Figure 5:
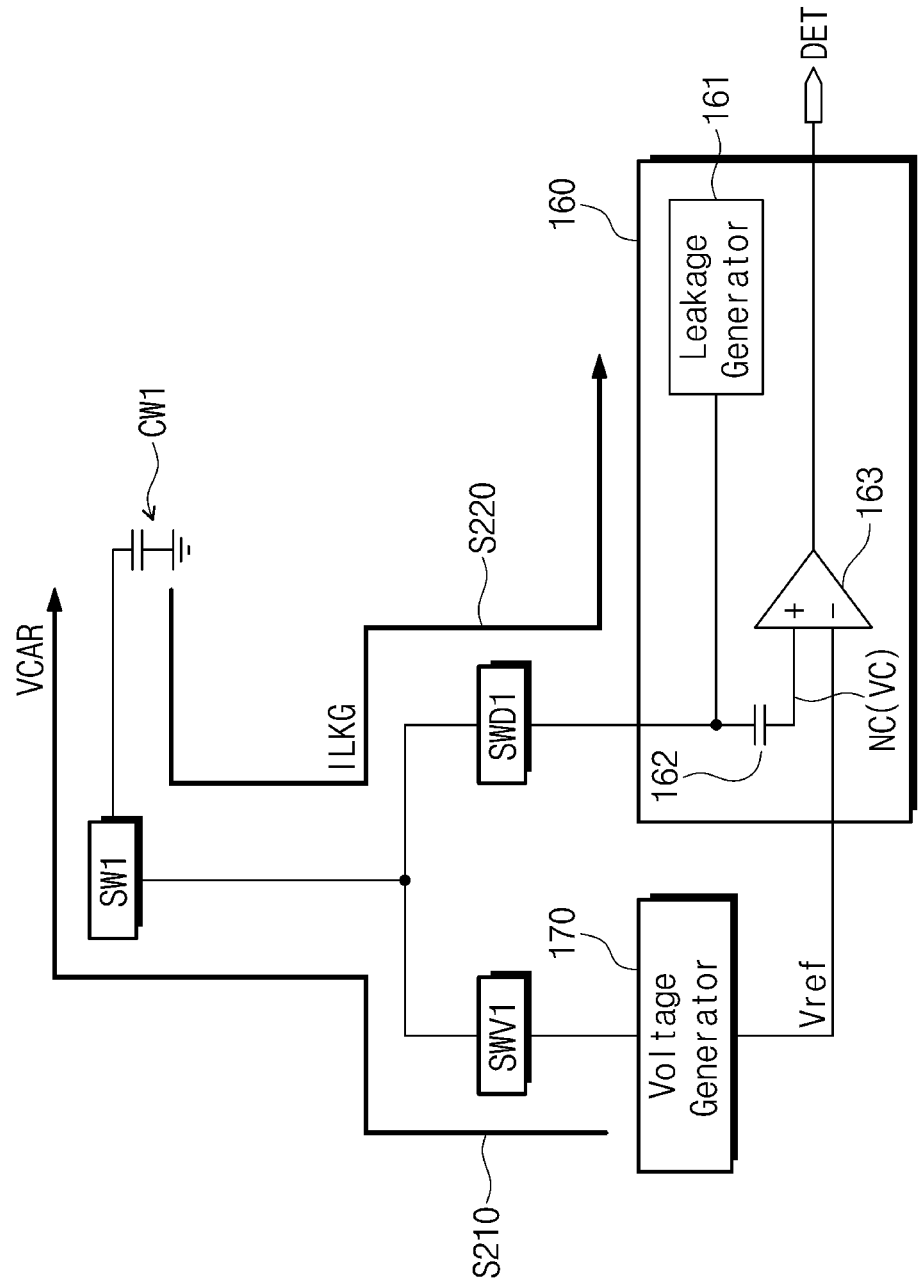
FIG. 5 illustrates a hybrid example of a circuit in which a first detection operation is performed according to an embodiment of the present disclosure.

FIG. 5 illustrates a hybrid example of a circuit in which a first detection operation is performed. An example in which a first detection operation is performed with regard to the first word line WL1 is illustrated in FIG. 5. Referring to FIGS. 2 and 5, the row decoder circuit 120 may turn on the first word switch SW1 corresponding to the first word line WL1.

In operation S210, the control logic circuit 150 may turn on the first word voltage switch SWV1 and may turn off the first word detecting switch SWD1. The voltage generator 170 may output a charging voltage VCAR. The charging voltage VCAR may be any voltage which is generally used in the nonvolatile memory device 100 or may have a particular level for a detection operation. The first word line WL1 modeled with the first word capacitor CW1 and a peripheral circuit associated with the first word line WL1 may be charged by the charging voltage VCAR. The charging with the charging voltage VCAR at S210 may be considered supplying a first charging voltage to a particular word line, in this example to the first word line WL1.

In operation S220, the control logic circuit 150 may turn off the first word voltage switch SWV1 and may turn on the first word detecting switch SWD1. The capacitance detector 160 may leak a fixed current, for example a leakage current ILKG, from the first word capacitor CW1 through the first word switch SW1 and the first word detecting switch SWD1. The leaked current ILKG that is leaked after S220 may be considered a first fixed current.

For example, the capacitance detector 160 includes a leakage generator 161, a capacitor 162, and a comparator 163. The leakage generator 161 may leak the leakage current ILKG. For example, the leakage generator 161 may be composed of a complex element such as a current mirror. For another example, the leakage generator 161 may be composed of a single element such as a resistor, a diode, or a transistor.

The capacitor 162 may provide a voltage of the first word capacitor CW1 and a peripheral circuit to a comparison node NC as a comparison voltage VC. The comparison voltage VC may be input to a positive input of the comparator 163, and a reference voltage Vref may be input to a negative input of the comparator 163. The reference voltage Vref may be generated by and output by the voltage generator 170.

While the leakage generator 161 leaks the leakage current ILKG (the first fixed current after S220), the voltage of the first word capacitor CW1 and the peripheral circuit gradually decreases from the charging voltage VCAR. In this case, the comparison voltage VC of the comparison node NC also decreases. When the comparison voltage VC is higher than the reference voltage Vref, the comparator 163 may output a detection signal DET having a high level. When the comparison voltage VC is lower than the reference voltage Vref, the comparator 163 may output the detection signal DET having a low level.

A capacitance is calculated by Equation 1 below.

$$C = I \cdot t / V \qquad [\text{Equation 1}]$$

According to Equation 1, a total capacitance "C" associated with the first word line WL1 may be calculated based on a time "t" from when the leakage generator 161 starts a leakage to when the detection signal DET becomes the low level, a variation "V" in the comparison voltage VC from when the leakage generator 161 starts a leakage to when the detection signal DET becomes the low level, and the amount "I" of leakage current ILKG.

A voltage of the capacitor 162 may be input to the positive input of the comparator 163. The positive input of the comparator 163 may be a gate of an internal transistor of the comparator 163. That is, the capacitor 162 may be in a floating state when viewed from the comparator 163. Accordingly, when the first word capacitor CW1 and the peripheral circuit are charged by the charging voltage VCAR, the comparison voltage VC may also increase to the charging voltage VCAR. When a voltage decreases by the leakage current ILKG, the comparison voltage VC also decreases. Accordingly, the variation "V" in the comparison voltage VC may be obtained from a difference between the charging voltage VCAR and the reference voltage Vref.

The amount "I" of the leakage current ILKG may depend on a design of the leakage generator 161. Accordingly, the amount "I" of the leakage current ILKG may be given information. The time "t" may be detected from a timing when the detection signal DET changes. For example, the comparator 163 may output the detection signal DET of the high level when the leakage generator 161 starts a leakage and may output the detection signal DET of the low level when the comparison voltage VC becomes lower than the reference voltage Vref.

Since the amount "I" of the leakage current ILKG and the variation "V" in the voltage are given, in the case where the time "t" is obtained from a transition timing of the detection signal DET, the total capacitance "C" may be calculated. To inform the outside (e.g., an external controller) of information about the time "t", the control logic circuit 150 may be configured to output as the time information the detection signal DET to the external controller. The comparison voltage VC is the voltage of a particular word line. The control logic circuit 150 may be configured to output as the time information the detection signal DET that is activated when the comparison voltage VC becomes lower than the reference voltage Vref. That is, the comparison voltage VC may be, for example, the voltage of one of the first word capacitor CW1 to eighth word capacitor CW8 which respectively model the capacitances of the first word line WL1 to eighth word line WL8 and can be used to output the detection signal DET as time information when the comparison voltage VC of a particular word line becomes lower than the reference voltage Vref.

Figure 6:
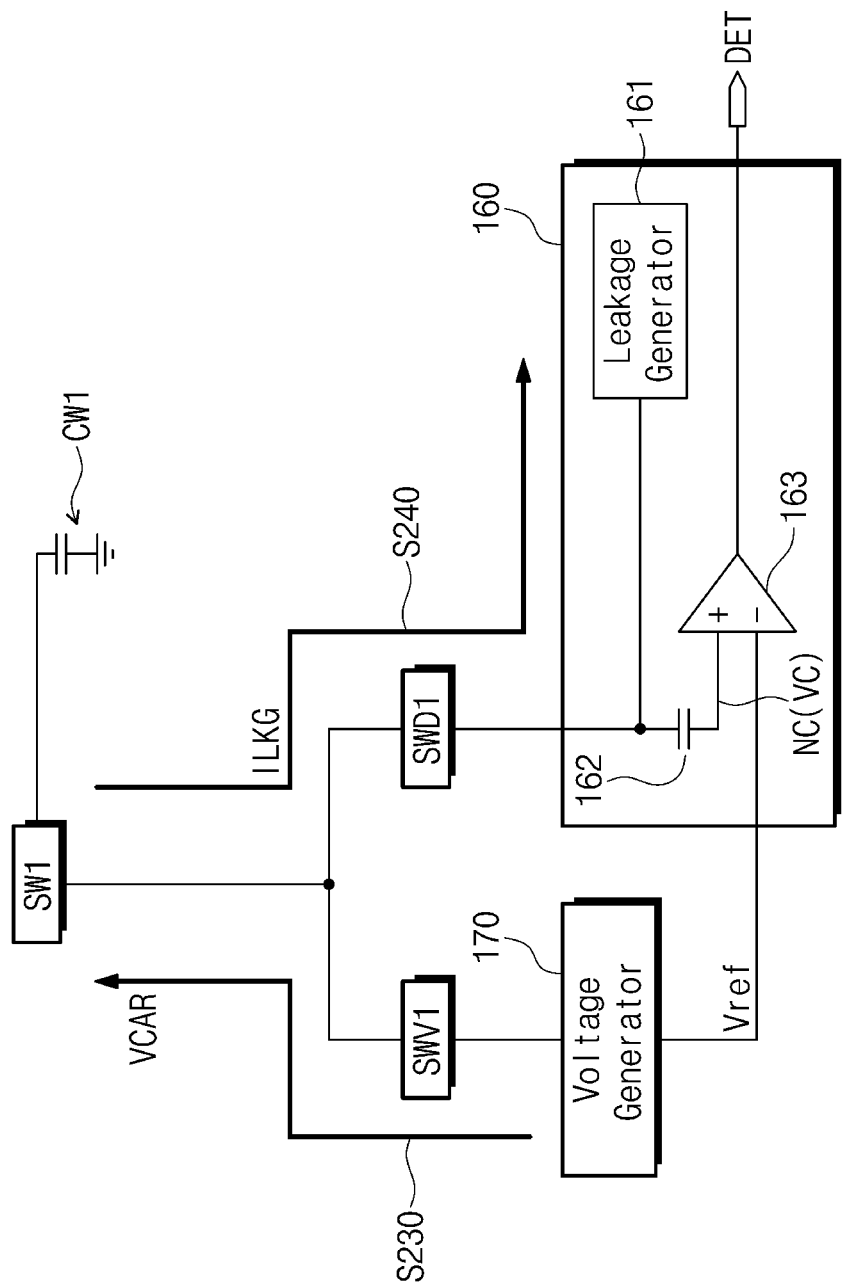
FIG. 6 illustrates a hybrid example of a circuit in which a second detection operation is performed according to an embodiment of the present disclosure.

FIG. 6 illustrates a hybrid example of a circuit in which a second detection operation is performed. An example in which a second detection operation is performed with regard to the first word line WL1 is illustrated in FIG. 6. Referring to FIGS. 2 and 6, the row decoder circuit 120 may turn off the first word switch SW1 corresponding to the first word line WL1.

In operation S230, the control logic circuit 150 may turn on the first word voltage switch SWV1 and may turn off the first word detecting switch SWD1. The voltage generator 170 may output the charging voltage VCAR. The peripheral circuit associated with the first word line WL1 may be charged by the charging voltage VCAR. The charging with the charging voltage VCAR at S230 may be considered supplying a second charging voltage to a particular word line, again in this example to the first word line WL1.

In operation S240, the control logic circuit 150 may turn off the first word voltage switch SWV1 and may turn on the first word detecting switch SWD1. The leakage generator 161 may leak the leakage current ILKG from the peripheral circuit of the first word line WL1 through the first word detecting switch SWD1. The leaked current ILKG that is leaked after S240 may again be a fixed current, and may be considered a second fixed current.

When the comparison voltage VC is lower than the reference voltage Vref, the comparator 163 may output the detection signal DET of the low level.

A capacitance of the peripheral circuit may be calculated based on Equation 1 and timings when the detection signal DET transitions. The control logic circuit 150 may output the detection signal DET to the external controller. The external controller may calculate a capacitance of the first word capacitor CW1, which is obtained by modeling the first word line WL1, by subtracting the capacitance of the peripheral circuit detected in the second detection operation from the total capacitance detected in the first detection operation.

A capacitance of any other word line, any other string selection line, or any other ground selection line may be calculated in the same manner as described with reference to FIGS. 5 and 6.

Figure 7:
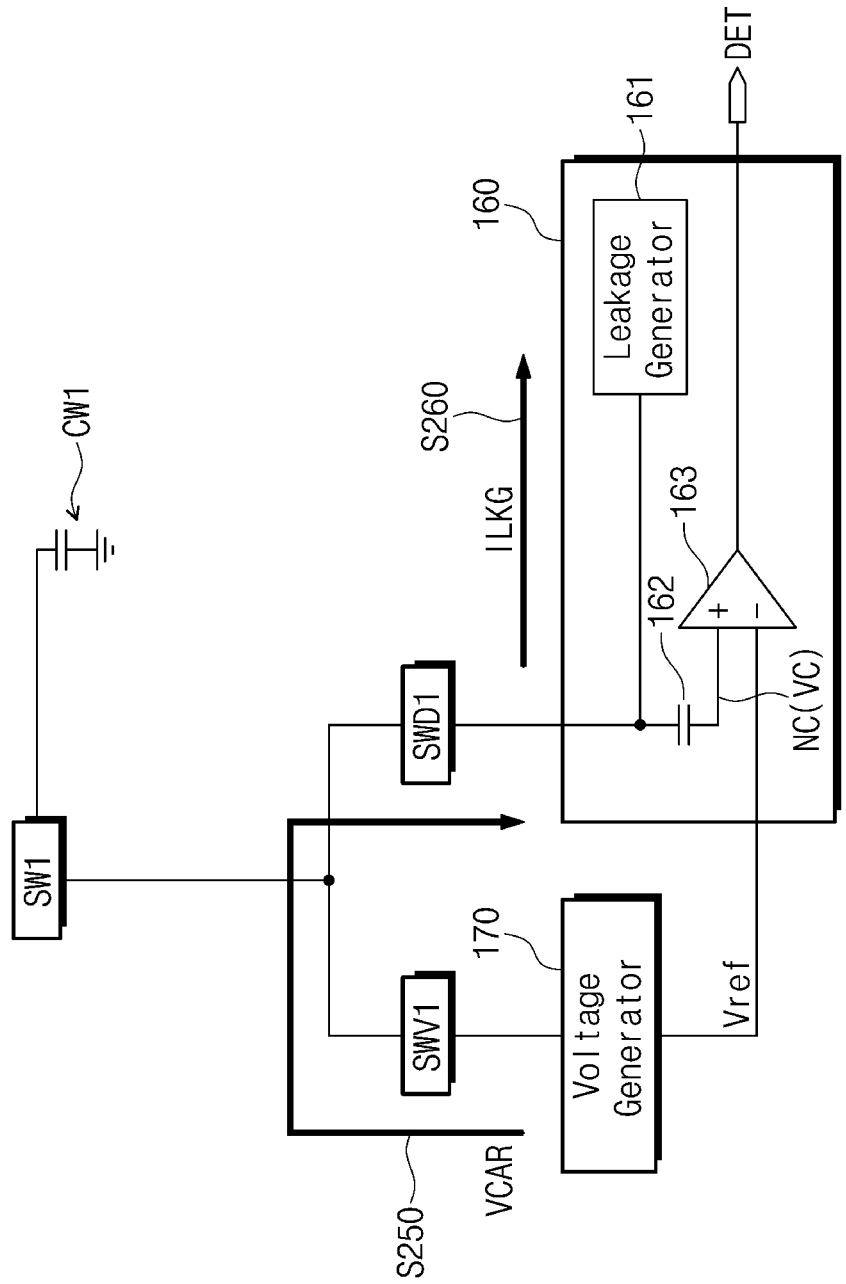
FIG. 7 illustrates a hybrid example of a circuit in which an operation for measuring the amount of leakage current is performed according to an embodiment of the present disclosure.

FIG. 7 illustrates a hybrid example of a circuit in which an operation for measuring the amount of leakage current ILKG is performed. Referring to FIGS. 1 and 7, the row decoder circuit 120 may turn off the first word switch SW1. The control logic circuit 150 may turn on the first word voltage switch SWV1 and the first word detecting switch SWD1.

In operation S250, the voltage generator 170 may output the charging voltage VCAR. In operation S260, the leakage generator 161 may leak the leakage current ILKG. The amount of the leakage current ILKG may be detected by measuring a voltage drop due to the leakage current ILKG at the leakage generator 161 or the voltage generator 170. The leakage current ILKG may be considered a second fixed current. The control logic circuit 150 may be configured to measure an amount of the second fixed current depending on (based on) a voltage drop that occurs upon (i.e., is due to the) leaking the second fixed current from the first word detecting switch SWD1. The control logic circuit 150 may output the detected amount of the leakage current ILKG to the external controller as the control signal CTRL or data "DATA".

In an embodiment, due to a process variable, leakage currents of nonvolatile memory devices may vary (be different in amount). The accuracy of the calculated capacitance is improved by detecting the amount of the leakage current ILKG and calculating a capacitance of a particular line by using the detected amount of the leakage current ILKG, as described with reference to FIG. 7.

Figure 8:
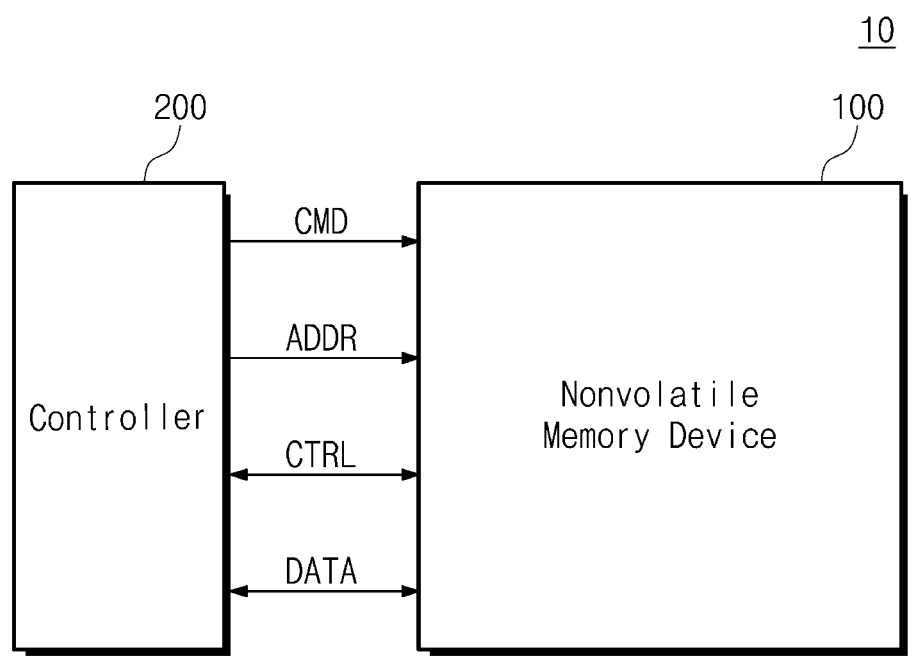
FIG. 8 is a block diagram illustrating a memory system according to an embodiment of the present disclosure.

FIG. 8 is a block diagram illustrating a memory system 10 according to an embodiment of the present disclosure. Referring to FIG. 8, the memory system 10 may include the nonvolatile memory device 100 and a controller 200. A configuration and an operation of the nonvolatile memory device 100 may be identical to those described with reference to FIGS. 1 to 7. Additionally, a controller may include, for example a memory that stores instructions and a processor that executes instructions. A processor for a controller that performs limited functions may be, for example, a microprocessor or an application specific integrated circuit.

The controller 200 may control the nonvolatile memory device 100. The controller 200 may transmit a command CMD and an address ADDR to the nonvolatile memory device 100. The controller 200 may exchange (e.g., transmit and receive) a control signal CTRL and data "DATA" with the nonvolatile memory device 100.

The controller 200 may include a test controller configured to tune and test the nonvolatile memory device 100 after the nonvolatile memory device 100 is manufactured. The controller 200 may include a memory controller configured to perform a write operation, a read operation, or an erase operation on the nonvolatile memory device 100 depending on (based on) a request of an external host device.

For example, the controller 200 may write data transmitted from the host device to the nonvolatile memory device 100 through the write operation. The controller 200 may read data stored in the nonvolatile memory device 100 through the read operation and may transmit the read data to the host device. The controller 200 may erase data stored in the nonvolatile memory device 100 through the erase operation.

The controller 200 may write metadata necessary to manage the nonvolatile memory device 100 to the nonvolatile memory device 100 and may read the metadata if necessary. For example, the metadata may include a mapping table for translating a logical address of the host device and a physical address of the nonvolatile memory device 100, data associated with a use history of the nonvolatile memory device 100, etc.

Figure 9:
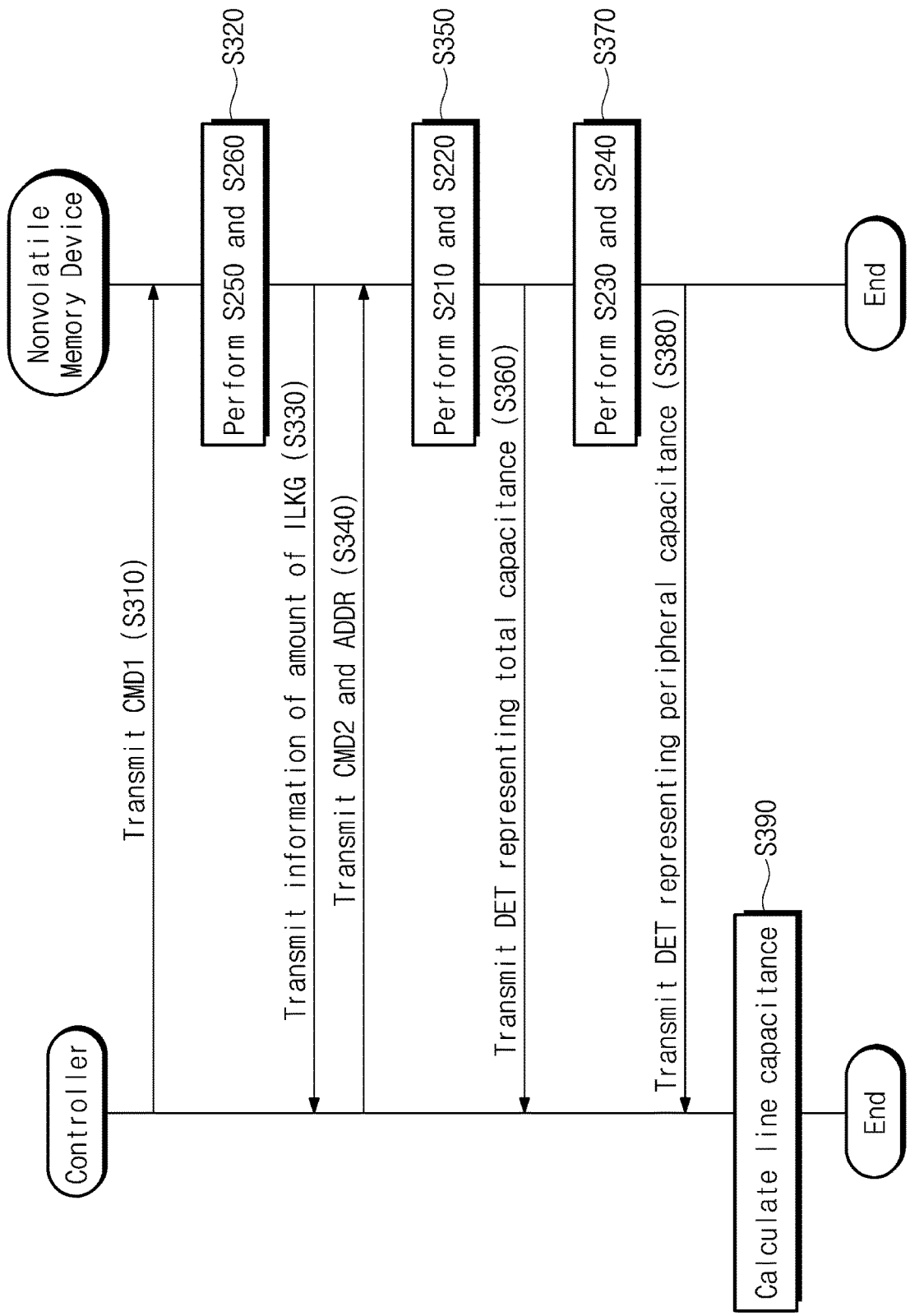
FIG. 9 is a flowchart illustrating an operating method of a memory system of FIG. 1 according to an embodiment of the present disclosure.

FIG. 9 is a flowchart illustrating an operating method of the memory system 10. Referring to FIGS. 8 and 9, in operation S310, the controller 200 may transmit a first command CMD1 to the nonvolatile memory device 100. For example, the first command CMD1 may request the nonvolatile memory device 100 to measure the amount of the leakage current ILKG.

In operation S320, in response to the first command CMD1, the nonvolatile memory device 100 may perform operation S250 and operation S260 described with reference to FIG. 7 and may measure the amount of the leakage current ILKG. In operation S330, in response to the first command CMD1, the nonvolatile memory device 100 may transmit information about the amount of the leakage current ILKG to the controller 200. The controller 200 may store the information about the amount of the leakage current ILKG.

In operation S340, the controller 200 may transmit a second command CMD2 and an address ADDR to the nonvolatile memory device 100. The second command CMD2 may request a total capacitance and a capacitance of a peripheral circuit. The address ADDR may indicate a line targeted for capacitance measurement.

In operation S350, in response to the second command CMD2, the nonvolatile memory device 100 may perform operation S210 and operation S220 described with reference to FIG. 5. That is, in operation S350, the nonvolatile memory device 100 may supply a first charging voltage, stop the supply of the first charging voltage, and leak a first fixed current. In operation S360, in response to the second command CMD2, the nonvolatile memory device 100 may transmit the detection signal DET representing the total capacitance to the controller 200. The controller 200 may obtain the time "t" of Equation 1 from transition timings of the detection signal DET.

Also, the controller 200 may obtain the amount "I" of the leakage current ILKG (operation S330). The controller 200 may store the variation "V" of a voltage of Equation 1 as information known in advance. The controller 200 may calculate the total capacitance based on the time "t", the amount "I" of the leakage current ILKG, and the variation "V" of the voltage.

In operation S370, in response to the second command CMD2, the nonvolatile memory device 100 may perform operation S230 and operation S240 described with reference to FIG. 6. That is, in operation S370, the nonvolatile memory device 100 may supply a second charging voltage, stop the supply of the second charging voltage, and leak a second fixed current. In operation S380, in response to the second command CMD2, the nonvolatile memory device 100 may transmit the detection signal DET representing the capacitance of the peripheral circuit to the controller 200. The controller 200 may obtain the time "t" of Equation 1 from transition timings of the detection signal DET. The controller 200 may calculate the capacitance of the peripheral circuit based on the time "t", the amount "I" of the leakage current ILKG, and the variation "V" of the voltage.

In operation S390, the controller 200 may calculate the capacitance of the line by subtracting the capacitance of the peripheral circuit from the total capacitance. For example, the controller 200 may calculate the capacitance of the line represented by the address ADDR.

In an embodiment, the controller 200 may perform operation S340 to operation S390 with respect to each of multiple lines targeted for capacitance measurement. For another example, when the second command CMD2 is received from the controller 200, the nonvolatile memory device 100 may perform operation S340 to operation S390 two times and may sequentially provide the controller 200 with information about capacitances of two or more lines. Operation S310 to operation S330 for measuring the amount of the leakage current ILKG may be performed only once for the first time even when operation S340 to operation S390 are subsequently performed repeatedly for multiple lines.

Figure 10:
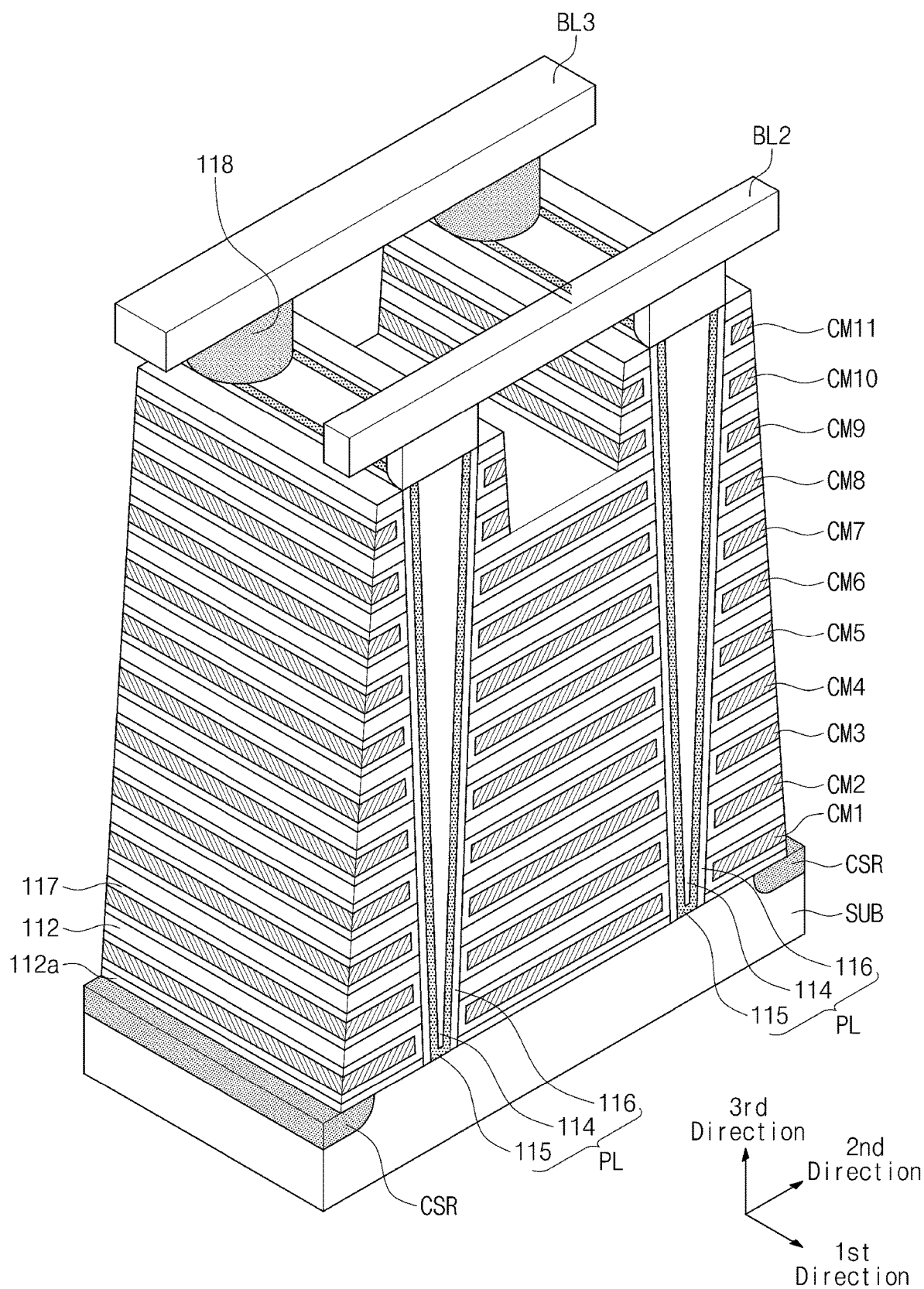
FIG. 10 is a perspective cross-sectional view illustrating a partial structure of a memory block of FIG. 2 according to an embodiment of the present disclosure.

FIG. 10 is a perspective cross-sectional view of a partial structure of the memory block BLKa of FIG. 2. Referring to FIGS. 2 and 10, common source regions CSR which extend along a first direction and are spaced from each other along a second direction are provided on the substrate SUB.

The common source regions CSR may be connected in common to each other to form a common source line CSL. In an embodiment, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate SUB along a third direction perpendicular to the substrate SUB. The insulating layers 112 and 112a may be spaced from each other along the third direction. In an embodiment, the insulating layers 112 and 112a may include silicon oxide or silicon nitride. In an embodiment, the thicknesses (e.g., thicknesses of (in) the third direction) of the insulating layer 112a, which is in contact with the substrate SUB, from among the insulating layers 112 and 112a may be thinner than the thicknesses (e.g., thicknesses of (in) the third direction) of each of the remaining insulating layers 112. As shown, multiple such insulating layers 112 are provided above the insulating layer 112a, interspersed with other layers as described below.

Pillars PL which are disposed to be spaced from each other along the first direction and the second direction and penetrate the insulating layers 112 and 112a along the third direction are provided between the common source regions CSR. In an embodiment, the pillars PL may be in contact with the substrate SUB through the insulating layers 112 and 112a. Each of the pillars PL may include an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more insulating layers (e.g., different insulating layers) such as a silicon oxide layer, a silicon nitride layer, and an aluminum oxide layer.

Between the common source regions CSR, second insulating layer(s) 117 are provided on upper surfaces and lower surfaces of the insulating layers 112 and 112a, and exposed outer surfaces of the pillars PL. The second insulating layer(s) 117 which are provided on an upper surface of the uppermost insulating layer of the insulating layers 112 and 112a may be removed.

The first insulating layer 116 in each of the pillars PL and the second insulating layer(s) 117 may be disposed adjacent to each other to form an information storage layer. As noted previously, the pillars PL with the first insulating layers 116 penetrate the insulating layers 112 and 112a along the third direction, but the pillars PL also penetrate the second insulating layer(s) 117 so that the first insulating layers 116 of the pillars PL may be disposed adjacent to the second insulating layer(s) 117. For example, the first insulating layer(s) 116 and the second insulating layer(s) 117 may include oxide-nitride-oxide (ONO) or oxide-nitride-aluminum (ONA). The first insulating layer(s) 116 and the second insulating layer(s) 117 may form a tunneling insulating layer, a charge trap layer, and a blocking insulating layer.

Conductive materials CM1 to CM11 are provided on exposed outer surfaces of the second insulating layer(s) 117 between the common source regions CSR and the insulating layer 112, between the insulating layer 112a and the lowest of the insulating layers 112, and between the insulating layers 112. The conductive materials CM1 to CM11 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers of the pillars PL.

The bit lines BL2 and BL3 which extend along the second direction and are spaced from each other along the first direction are provided on the drains 118. The bit lines BL2 and BL3 are connected with the drains 118. In an embodiment, the drains 118 and bit lines (e.g., BL2 and BL3) may be connected to each other through contact plugs. The bit lines BL2 and BL3 may include a metallic conductive material.

The pillars PL form cell strings CS together with the second insulating layer 117 and the conductive materials CM1 to CM11. Each of the pillars PL forms a cell string together with the second insulating layer(s) 117 and the conductive materials CM1 to CM11 adjacent to the second insulating layer(s) 117. The first conductive material CM1 may form ground selection transistors GST together with the first insulating layers 116 and second insulating layers 117 and the channel layers 115 adjacent to the first insulating layers 116. The first conductive material CM1 may extend along the first direction to form the ground selection line GSL.

The second conductive material CM2 to the ninth conductive material CM9 may form a first memory cell MC1 to an eighth memory cell MC8 together with the first insulating layers 116 and second insulating layers 117 and the channel layers 115 adjacent to the first insulating layers 116. The second conductive material CM2 to the ninth conductive material CM9 may extend along the first direction to form a first word line WL1 to an eighth word line WL8, respectively.

The tenth conductive materials CM10 may form lower string selection transistors, which are adjacent to the substrate SUB, from among the string selection transistors SST together with the first insulating layerss 116 and second insulating layers 117 and the channel layers 115 adjacent to the first insulating layers 116. The tenth conductive materials CM10 may extend along the first direction to form lower string selection lines, which are close to the substrate SUB, from among the string selection lines SSL1 to SSL4.

The eleventh conductive materials CM11 may form the string selection transistors, which are adjacent to the bit lines BL1 to BL4, from among the string selection transistors SST together with the first insulating layers 116 and second insulating layers 117 and the channel layers 115 adjacent to the first insulating layers 116. The eleventh conductive materials CM11 may extend along the first direction to form upper string selection lines, which are close to the substrate SUB, from among the string selection lines SSL1 to SSL4.

As the first conductive material CM1 to the eleventh conductive material CM11 are stacked along the third direction, in each cell string, the ground selection transistor GST, the memory cells MC1 to MC8, and the string selection transistors SST may be stacked along the third direction.

As the channel layer 115 is shared by the first conductive material CM1 to the eleventh conductive material CM11 in each of the pillars PL, in each cell string, the ground selection transistor GST, the memory cells MC1 to MC8, and the string selection transistors SST may be serially connected along the third direction.

As the first conductive material CM1 to the ninth conductive material CM9 are connected in common, the ground selection line GSL and the first word line WL1 to the eighth word line WL8 may be viewed as being connected in common in the cell strings CS.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present disclosure, the 3D memory array includes vertical cell strings CS (or NAND strings) that are vertically oriented such that at least one memory cell is located over another memory cell. The at least one memory cell may include a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as multiple levels, with word lines and/or bit lines shared between levels: U.S. Pat. Nos. 7,679,133; 8,553,466; 8,654,587; 8,559,235; and US Pat. Pub. No. 2011/0233648.

As described with reference to FIG. 10, the memory block BLKa may be configured to have a stacked structure perpendicular to the substrate SUB. In this case, shapes and sizes (e.g., cross-sectional areas) of the ground selection line GSL corresponding to the first conductive material CM1, the word lines WL1 to WL8 corresponding to the second conductive material CM2 to the ninth conductive material CM9, and the string selection lines SSL1 to SSL4 corresponding to the tenth conductive material CM10 and the eleventh conductive material CM11, may vary.

In the case where the shapes and sizes of the ground selection line GSL, the word lines WL1 to WL8, and the string selection lines SSL1 to SSL4 are different, capacitances of the ground selection line GSL, the word lines WL1 to WL8, and the string selection lines SSL1 to SSL4 may be different, According to an embodiment of the present disclosure, the nonvolatile memory device 100 and the memory system 10 may support measuring the capacitances of the ground selection line GSL, the word lines WL1 to WL8, and the string selection lines SSL1 to SSL4. Accordingly, capacitances may be measured according to the shapes and sizes of the ground selection line GSL, the word lines WL1 to WL8, and the string selection lines SSL1 to SSL4.

As such, performance and power consumption of the nonvolatile memory device 100 and the memory system 10 may be observed more accurately. Also, the capacitances of the ground selection line GSL, the word lines WL1 to WL8, and the string selection lines SSL1 to SSL4 may be used to improve the process for minimizing fluctuations in the capacitances.

Figure 11:
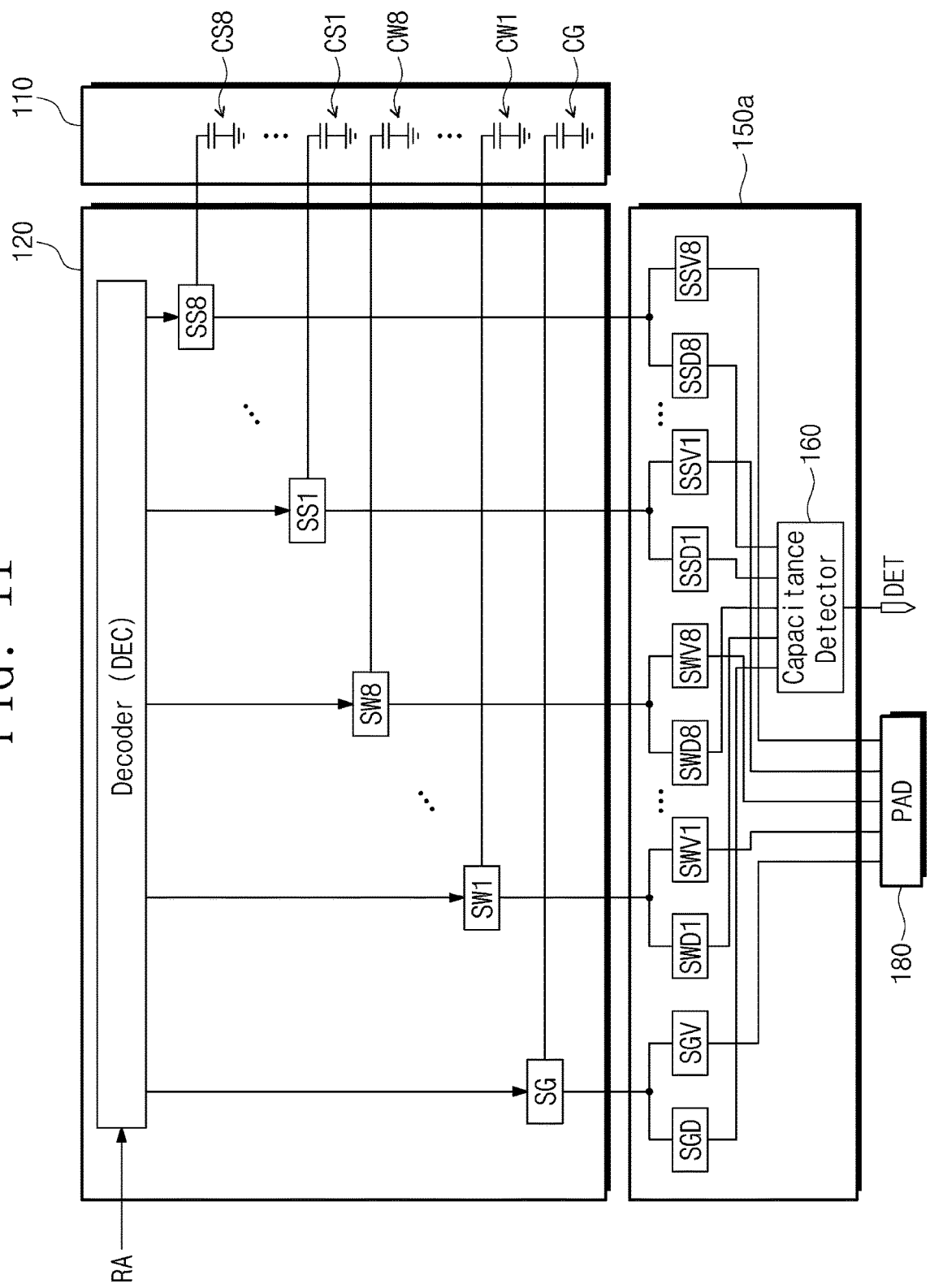
FIG. 11 is a diagram illustrating an application example of a control logic circuit of FIG. 3 according to an embodiment of the present disclosure.

FIG. 11 is a diagram illustrating an application example of the control logic circuit 150 of FIG. 3. Referring to FIGS. 3, 8, and 11, the first string voltage switch SSV1 to the eighth string voltage switch SSV8, the first word voltage switch SWV1 to the eighth word voltage switch SWV8, and the ground voltage switch SGV of a control logic circuit 150a may be connected to a pad 180 instead of the voltage generator 170. The voltage generator 170 may not participate in an operation of the capacitance detector 160, thus omitted in FIG. 11.

The pad 180 may be connected with the controller 200. The controller 200 may supply (transmit) a charging voltage to the control logic circuit 150a through the pad 180. For example, upon transmitting the first command CMD1 in operation S310 of FIG. 9 or upon transmitting the second command CMD2 and the address ADDR in operation S340 of FIG. 9, the controller 200 may supply the charging voltage to the pad 180 due to the transmitting the first command CMD1 or transmitting the second command CMD2 and the address ADDR.

After receiving the information in operation S330 of FIG. 9 or after receiving the information in operation S380 of FIG. 9, the controller 200 may stop supplying the charging voltage to the pad 180. In the case where the controller 200 supplies the charging voltage through the pad 180, as described with reference to FIG. 7, the amount of the leakage current ILKG may be detected more accurately.

For example, the pad 180 may be used to transmit any other signal in a general mode and may be used to supply the charging voltage in a mode to detect a capacitance. For another example, the pad 180 may be used for the controller 200 to continuously supply the charging voltage to the nonvolatile memory device 100. The charging voltage may be a power supply voltage which is supplied to the nonvolatile memory device 100.

Figure 12:
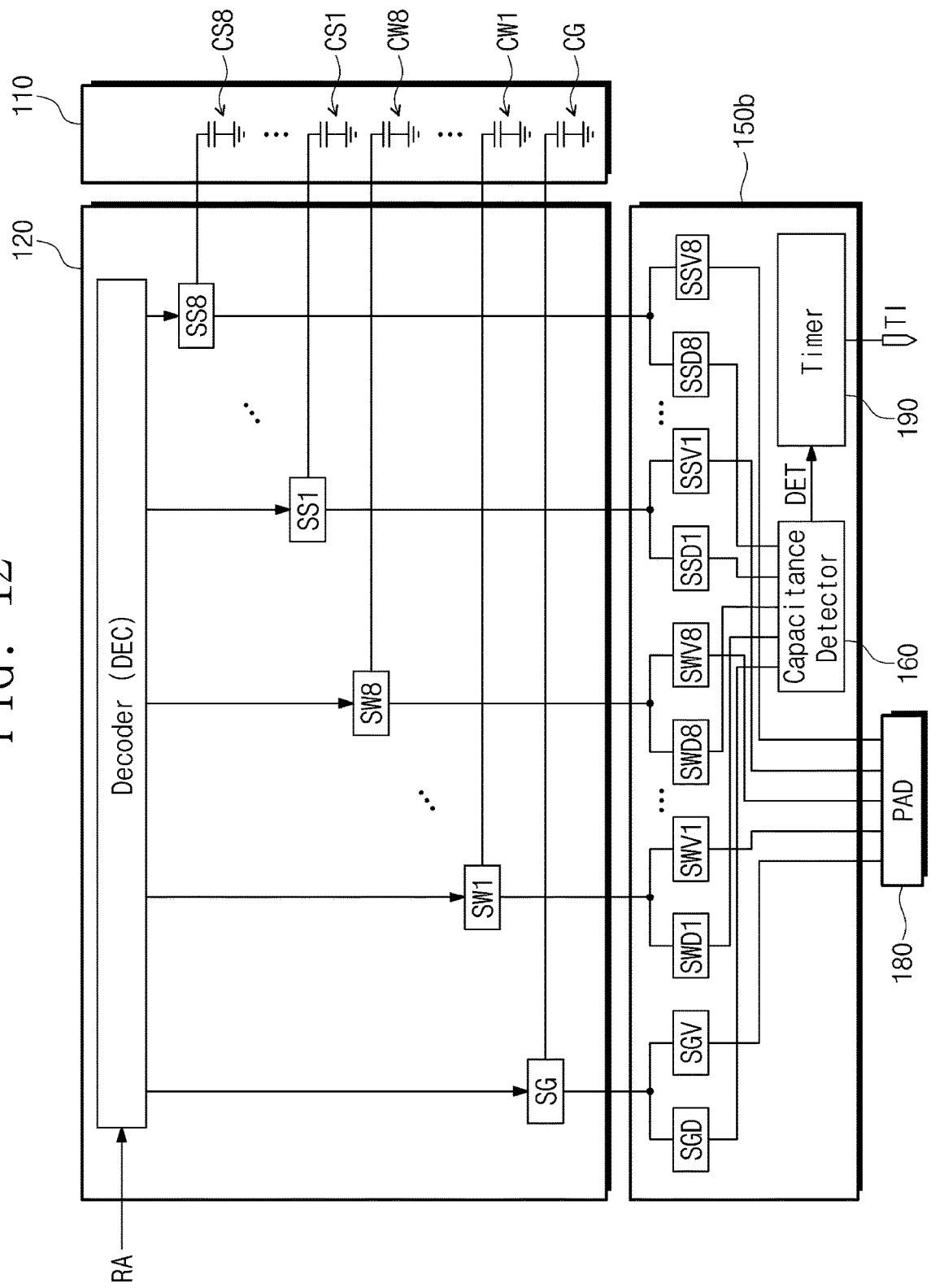
FIG. 12 is a diagram illustrating an application example of a control logic circuit of FIG. 11 according to an embodiment of the present disclosure.

FIG. 12 is a diagram illustrating an application example of the control logic circuit 150a of FIG. 11. Referring to FIGS. 8, 11, and 12, the control logic circuit 150b may include a timer 190. The capacitance detector 160 of the control logic circuit 150b may output the detection signal DET to the timer 190, rather than to the controller 200 that is external.

The timer 190 may obtain time information TI from transition timings of the detection signal DET. The time information TI may be a measured time. For example, the timer 190 may obtain as a measured time a time from when the capacitance detector 160 starts a leakage of a fixed current to when the detection signal DET transitions to the low level, as the time information TI. The timer 190 may output the time information TI to the controller 200 that is external.

For example, the time information TI may be transmitted to the controller 200 through the second channel (e.g., the control channel) as the control signal CTRL. For another example, the time information TI may be transmitted to the controller 200 through the first channel (e.g., the input/output channel) as the data "DATA".

In an embodiment, as described with reference to FIG. 3, the charging voltage VCAR may be transmitted from the voltage generator 170 instead of the pad 180.

Figure 13:
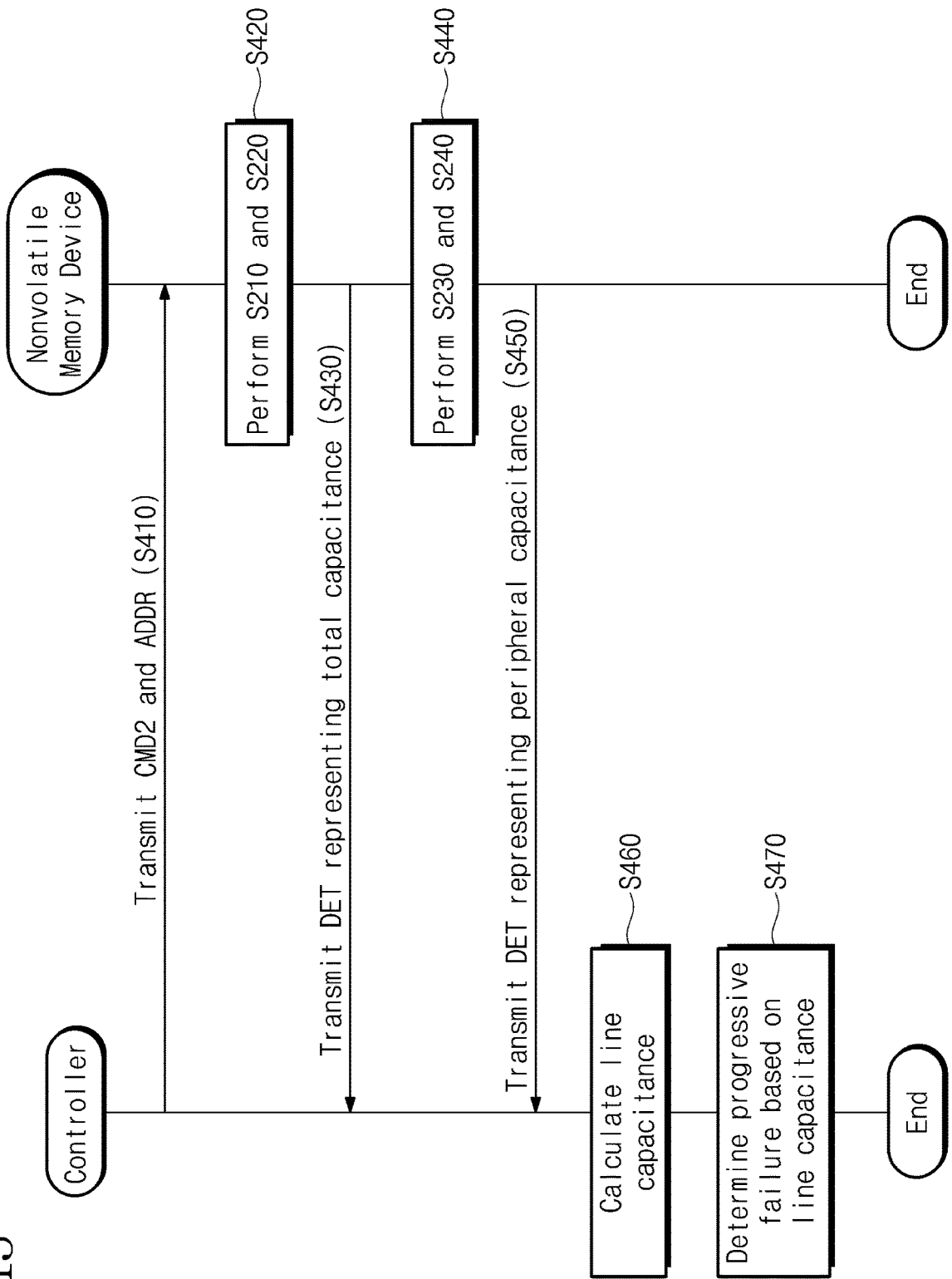
FIG. 13 is a flowchart illustrating an example in which a memory system adaptively detects a capacitance according to an embodiment of the present disclosure.

FIG. 13 is a flowchart illustrating an example in which the memory system 10 adaptively detects a capacitance. Referring to FIGS. 8 and 13, the controller 200 may be a memory controller which performs a write operation, a read operation, or an erase operation on the nonvolatile memory device 100 depending on (based on) a request of a host device.

When an operation error occurs while the controller 200 performs the write operation, the read operation, or the erase operation on the nonvolatile memory device 100, the controller 200 may measure capacitances of lines associated with the operation error.

In operation S410, the controller 200 may transmit the second command CMD2 and the address ADDR to the nonvolatile memory device 100. In an embodiment, the amount of the leakage current ILKG may be detected upon (based on) testing the nonvolatile memory device 100 (operation S310 to S330 of FIG. 9), and the detected amount of the leakage current ILKG may be stored to the controller 200. Accordingly, operations which are necessary to measure the amount of the leakage current ILKG upon (based on) measuring a capacitance adaptively may be omitted. The address ADDR may be associated with lines where the operation error occurs. For example, the address ADDR may represent a word line or word lines where the operation error occurs.

In operation S420, the nonvolatile memory device 100 may perform operation S210 and operation S220 of FIG. 9 to measure a total capacitance associated with a line corresponding to the address ADDR. In operation S430, the nonvolatile memory device 100 may transmit the detection signal DET representing the total capacitance to the controller 200.

In operation S430, the nonvolatile memory device 100 may perform operation S230 and operation S240 of FIG. 9 to measure a capacitance of a peripheral circuit associated with the line corresponding to the address ADDR. In operation S440, the nonvolatile memory device 100 may transmit the detection signal DET representing the capacitance of the peripheral circuit to the controller 200.

In operation S450, the nonvolatile memory device 100 may calculate a capacitance of the line corresponding to the address ADDR. In operation S460, the controller 200 may determine a progressive failure of the nonvolatile memory device 100 based on the calculated capacitance. For example, when the calculated capacitance is smaller than a threshold or is greater than the threshold, the controller 200 may determine that a progressive failure occurs at a line or lines associated with the address ADDR.

When the progressive failure is determined, the controller 200 may perform failure processing depending on (based on) a preset procedure. For example, the controller 200 may set (e.g., designate as) a storage space associated with the address ADDR to a bad area and may prohibit an access to the bad area.

In an embodiment, the controller 200 may perform operation S410 to operation S460 with respect to each of lines targeted for capacitance measurement. For another example, when the second command CMD2 and the address ADDR are received from the controller 200, the nonvolatile memory device 100 may perform operation S420 to operation S440 two times and may provide the controller 200 with information about capacitances of two or more lines. The controller 200 may calculate capacitances of the two or more lines (corresponding to operation S450) and may determine a progressive failure (corresponding to operation S460).

As described above, according to an embodiment of the present disclosure, the nonvolatile memory device 100, the memory system 10, and the nonvolatile memory device controlling method are provided which support measuring capacitances of lines connected with memory cells. Operating performance and power consumption of the nonvolatile memory device 100 may be accurately determined by measuring the capacitances. Also, the capacitances may be used to improve the processing by and functionality of the nonvolatile memory device 100.

A configuration which makes it possible to measure capacitances with reference to word lines, string selection lines, and ground selection lines connected with rows of memory cells is described to convey the scope and spirit of the present disclosure easily. However, the scope and spirit of the inventive concept(s) described herein may be applied to any other lines connected with memory cells.

A configuration which makes it possible to measure capacitances of lines connected with memory cells of a flash memory is described to convey the scope and spirit of the present disclosure easily. However, the scope and spirit of the inventive concept(s) described herein may be applied to any other lines connected with any kind of memory cells.

As described above, components of the nonvolatile memory device 100 are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above embodiments, components according to embodiments of the present disclosure are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits including unique technologies protected by intellectual property (IP) and implemented with semiconductor elements in an integrated circuit.

According to the present disclosure, a nonvolatile memory device may output first information representing a total capacitance of a word line and a peripheral circuit and second information representing a capacitance of the peripheral circuit. Accordingly, the nonvolatile memory device supporting the measurement of characteristics of the nonvolatile memory device, a memory system including the nonvolatile memory device, and a method of controlling the nonvolatile memory device are provided.

While the inventive concept(s) of the present disclosure have been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A nonvolatile memory device, comprising:
a memory cell array that includes memory cells;
a row decoder that is connected to the memory cells through word lines and that includes switches configured to select the word lines, respectively;
a page buffer circuit connected to the memory cell array through bit lines; and
a control logic circuit, which, when the row decoder turns on a switch corresponding to a particular word line among the word lines, is configured to:
supply a first charging voltage to the particular word line through the switch;
stop the supply of the first charging voltage after the first charging voltage is supplied to the particular word line;
leak a first fixed current from the particular word line through the switch after stopping the supply of the first charging voltage; and
output, to an external device, time information about a time from when the first fixed current is initially leaked to a time when a voltage of the particular word line becomes lower than a reference voltage,
wherein the control logic circuit receives an address representing the particular word line and a command requesting the time information and outputs the time information depending on the address and the command.

2. The nonvolatile memory device of claim 1, wherein the control logic circuit is configured to output as the time information a detection signal that is activated when the voltage of the particular word line becomes lower than the reference voltage.

3. The nonvolatile memory device of claim 1, wherein the control logic circuit includes:
a voltage generator configured to output the first charging voltage and the reference voltage;

a voltage switch configured to selectively connect the voltage generator and the row decoder;
a detecting switch connected to the row decoder; and
a capacitance detector connected to the detecting switch and configured to detect a capacitance applied to the detecting switch.

4. The nonvolatile memory device of claim 3, wherein the capacitance detector includes:
a capacitor connected to the detecting switch;
a leakage generator connected to the detecting switch, and configured to leak the first fixed current; and
a comparator configured to obtain a result of a comparison by comparing a voltage input to the capacitor and the reference voltage and to output the result of the comparison as the time information.

5. The nonvolatile memory device of claim 1, wherein the control logic circuit includes:
a capacitance detector configured to activate a detection signal when the voltage of the particular word line becomes lower than the reference voltage; and
a timer configured to measure as a measured time a time from when the first fixed current is initially leaked to when the detection signal is activated and to output the measured time as the time information.

6. The nonvolatile memory device of claim 1, further comprising:
a pad configured to supply to the control logic circuit a voltage transmitted from the external device, as at least one of the first charging voltage and the reference voltage.

7. The nonvolatile memory device of claim 1, wherein the control logic circuit is further configured to:
supply a second charging voltage to the switch when the row decoder turns off the switch;
stop the supply of the second charging voltage after the second charging voltage is supplied to the switch;
leak a second fixed current from the switch after stopping the supply of the second charging voltage; and
output, to the external device, second time information about a second time from when the second fixed current is initially leaked to a time when a voltage of the switch becomes lower than a second reference voltage.

8. The nonvolatile memory device of claim 7, wherein the second charging voltage is identical to the first charging voltage, the second fixed current is identical to the first fixed current, and the second reference voltage is identical to the reference voltage.

9. The nonvolatile memory device of claim 1, wherein the control logic circuit is further configured to supply, based on the row decoder turning off the switch, a second charging voltage to the switch and measure an amount of a second fixed current depending on a voltage drop upon leaking the second fixed current from the switch.

10. The nonvolatile memory device of claim 9, wherein the control logic circuit outputs information about the amount of the second fixed current to the external device.

11. The nonvolatile memory device of claim 9, wherein the control logic circuit receives a command requesting information about the amount of the second fixed current and outputs the information about the amount of the second fixed current depending on the command.

12. A memory system, comprising:
a nonvolatile memory device that includes memory cells connected to word lines and bit lines; and
a controller configured to transmit a command and an address to the nonvolatile memory device,
wherein, in response to the command, the nonvolatile memory device is configured to transmit, to the controller, first information representing a total capacitance including a first capacitance of a word line corresponding to the address among the word lines and a second capacitance of a peripheral circuit associated with the word line, and second information representing the second capacitance of the peripheral circuit, and
wherein the controller is further configured to calculate the first capacitance of the word line based on the first information and the second information.

13. The memory system of claim 12, wherein the controller is further configured to test the nonvolatile memory device.

14. The memory system of claim 12, wherein the controller is further configured to perform a write operation, a read operation, or an erase operation on the nonvolatile memory device depending on a request of a host device, and to store metadata for managing the nonvolatile memory device to the nonvolatile memory device.

15. The memory system of claim 14, wherein the controller is further configured to perform the write operation, the read operation, or the erase operation on the nonvolatile memory device depending on the request of the host device, and to calculate the first capacitance of the word line when an operation error occurs.

16. The memory system of claim 15, wherein the controller is further configured to determine a progressive failure of the word line based on the first capacitance of the word line.

17. The memory system of claim 12, wherein the nonvolatile memory device is further configured to:
detect the first information representing the total capacitance by leaking a fixed current from the word line and the peripheral circuit after charging a charging voltage to the word line and the peripheral circuit; and
detect the second information representing the second capacitance of the peripheral circuit by leaking the fixed current from the peripheral circuit after charging the charging voltage to the peripheral circuit.

18. The memory system of claim 17, wherein the controller is further configured to transmit a second command to the nonvolatile memory device, and
wherein, in response to the second command, the nonvolatile memory device is further configured to transmit third information representing an amount of the fixed current to the controller.

19. A control method of controlling a nonvolatile memory device which includes memory cells connected with a word line, the method comprising:
charging a charging voltage to the word line and a peripheral circuit connected with the word line;
leaking a fixed current from the peripheral circuit to detect a total capacitance of the word line and the peripheral circuit;
charging the charging voltage to the peripheral circuit;
leaking the fixed current from the peripheral circuit to detect a capacitance of the peripheral circuit; and
subtracting the capacitance of the peripheral circuit from the total capacitance to calculate a capacitance of the word line.

* * * * *